(12) United States Patent
Kim et al.

(10) Patent No.: US 10,490,158 B2
(45) Date of Patent: Nov. 26, 2019

(54) DATA DRIVING APPARATUS, DATA PROCESSING APPARATUS AND DRIVING SYSTEM FOR DISPLAY PANEL

(71) Applicant: SILICON WORKS CO., LTD., Daejeon (KR)

(72) Inventors: Myung Yu Kim, Daejeon (KR); Hyun Pyo Cho, Daejeon (KR); Byung-Guk Kim, Daejeon (KR); Hyun Kyu Jeon, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/221,238

(22) Filed: Dec. 14, 2018

(65) Prior Publication Data

US 2019/0197987 A1 Jun. 27, 2019

(30) Foreign Application Priority Data

Dec. 21, 2017 (KR) .................. 10-2017-0177305

(51) Int. Cl.
G09G 5/00 (2006.01)
H03M 7/30 (2006.01)
H04L 7/033 (2006.01)

(52) U.S. Cl.
CPC .......... G09G 5/008 (2013.01); H03M 7/6005 (2013.01); H03M 7/6011 (2013.01); H04L 7/033 (2013.01)

(58) Field of Classification Search
CPC ................... G09G 2310/02; G09G 2310/0243
See application file for complete search history.

(56) References Cited

U.S. PATENT DOCUMENTS

| | | | |
|---|---|---|---|
| 9,361,825 B2 | 6/2016 | Jeong et al. | |
| 2014/0146058 A1 | 5/2014 | Jeong et al. | |
| 2015/0049076 A1* | 2/2015 | Kim | G09G 3/20 345/212 |

FOREIGN PATENT DOCUMENTS

| | | |
|---|---|---|
| KR | 10-2011-0004801 A | 1/2011 |
| KR | 10-2014-0068524 A | 6/2014 |

* cited by examiner

*Primary Examiner* — Kevin Kim
(74) *Attorney, Agent, or Firm* — Fenwick & West LLP

(57) ABSTRACT

The present disclosure provides a technology indicating information different from each other by patterns of link data in a process of training links performed prior to transmitting image data.

15 Claims, 9 Drawing Sheets

DATA DRIVING APPARATUS, DATA PROCESSING APPARATUS AND DRIVING SYSTEM FOR DISPLAY PANEL

CROSS REFERENCE TO RELATED APPLICATION

This application claims priority from Republic of Korea Patent Application No. 10-2017-0177305, filed on Dec. 21, 2017, which is hereby incorporated by reference in its entirety.

BACKGROUND

1. Field of Technology

The present disclosure relates to a technology for driving a display panel.

2. Description of the Prior Art

A display panel comprises multiple pixels arranged in a matrix, and each pixel comprises sub-pixels such as red (R), green (G), and blue (B). Each sub-pixel emits light with a grayscale value according to an image data, thereby displaying an image on the display panel.

Image data is transmitted from a data processing apparatus called a timing controller to a data driving apparatus called a source driver. Image data is transmitted in a form of digital values and the data driving apparatus converts image data into analog voltage to drive each sub-pixel.

Since image data indicates the grayscale value of each pixel individually or independently, the amount of image data increases as the number of pixels disposed on a display panel increases. In addition, as the frame rate increases, the amount of image data to be transmitted per unit time increases.

Recently, as a display panel has higher resolution, both the number of pixels disposed on a display panel and the frame rate have increased. Also, to process an increased amount of image data according to high resolution, data communication in a display device is required to be faster.

A data driving apparatus may change the receiving mode of image data. A conventional data driving apparatus may check set values by sensing an external signal such as voltage or an external element such as resistance or from configuration data received through data communication.

However, a method of sensing set values through a specific terminal increases the size of a data driving apparatus, that is, the size of an integrated circuit (IC) chip or complicates external wirings of a data driving apparatus and a method of receiving configuration data through data communication is vulnerable to noise as the data communication becomes faster.

SUMMARY

With this background, an aspect of the present disclosure is to provide a technology for stably and efficiently transferring set values to an image data receiving apparatus.

To this end, an embodiment of the present disclosure provides a data driving apparatus comprising a data receiving part for training a communication clock according to received clock patterns, receiving, in accordance with the communication clock, at least one link data selected from multiple link data respectively including same or different information, training a data link in accordance with the at least one link data, receiving image data in accordance with the data link, and converting the image data to generate grayscale data for each sub-pixel; and a data driving part for generating data voltage according to the grayscale data and driving each sub-pixel with the data voltage, wherein the data receiving part converts the image data according to at least one information included in the at least one link data.

In the data driving apparatus, the at least one information may include information about the operation mode of a decoder used for the conversion of the image data.

In the data driving apparatus, the at least one information may include information about the limited run length code (LRLC) and the data receiving part may decode the image data according to the information about the LRLC.

In the data driving apparatus, the at least one information may include information about the maximum run length (MRL) and the data receiving part may decode the image data according to the information about the MRL.

In the data driving apparatus, at least two link data among the multiple link data may have different cycles of repeated patterns.

In the data driving apparatus, the at least one information may include information about the number of pairs of communication lines or the number of communication lines through which the image data is transmitted and the data receiving part may convert the image data according to the number of pairs of communication lines or the number of communication lines.

In the data driving apparatus, the data receiving part may train the data links by performing the arrangement of the link data by the byte unit and by the pixel unit.

In the data driving apparatus, the at least one information may include information about the operation mode of a descrambler used for the conversion of the image data.

The data driving apparatus may be disposed in a chip-on-glass (COG) manner on the periphery of an active area of a panel where the sub-pixels are disposed.

In the data driving apparatus, the data receiving part may receive configuration data in accordance with the data links. The range of the data voltage may be larger than that of the configuration data voltage.

Another embodiment of the present disclosure provides a data processing apparatus comprising a data transmitting part for transmitting clock patterns indicating a communication clock to the data driving apparatus which drives sub-pixels, and synchronizing at least one link data selected from multiple link data respectively including same or different information with the communication clock to transmit the same to the data driving apparatus; and a data processing part for encoding image data according to at least one information included in the at least one link data, wherein the data transmitting part transmits the image data to the data driving apparatus where a data link is formed according to the at least one link data.

In the data processing apparatus, the data transmitting part may transmit again the at least one link data after receiving a lock signal.

In the data processing apparatus, the data transmitting part may scramble the image data or encode the image data with the LRLC.

In the data processing apparatus, the multiple link data may differ from each other in the kinds of symbols or the disposition of symbols.

Another embodiment of the present disclosure provides a display driving system comprising a data processing apparatus for transmitting a clock patterns indicating a communication clock, synchronizing at least one link data selected from multiple link data respectively including same or different information with the communication clock to transmit the same, and encoding image data according to at least one information included in the at least one link data; and a data driving apparatus for training the communication clock according to the received clock patterns, receiving the at least one link data in accordance with the communication clock, training a data link according to the at least one link data, receiving the image data in accordance with the data link, and converting the image data according to the at least one information included in the at least one link data to generate grayscale data for each sub-pixel.

As described above, the present disclosure allows stably and efficiently transferring set values to an image data receiving apparatus.

DETAILED DESCRIPTION

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

Figure 1:
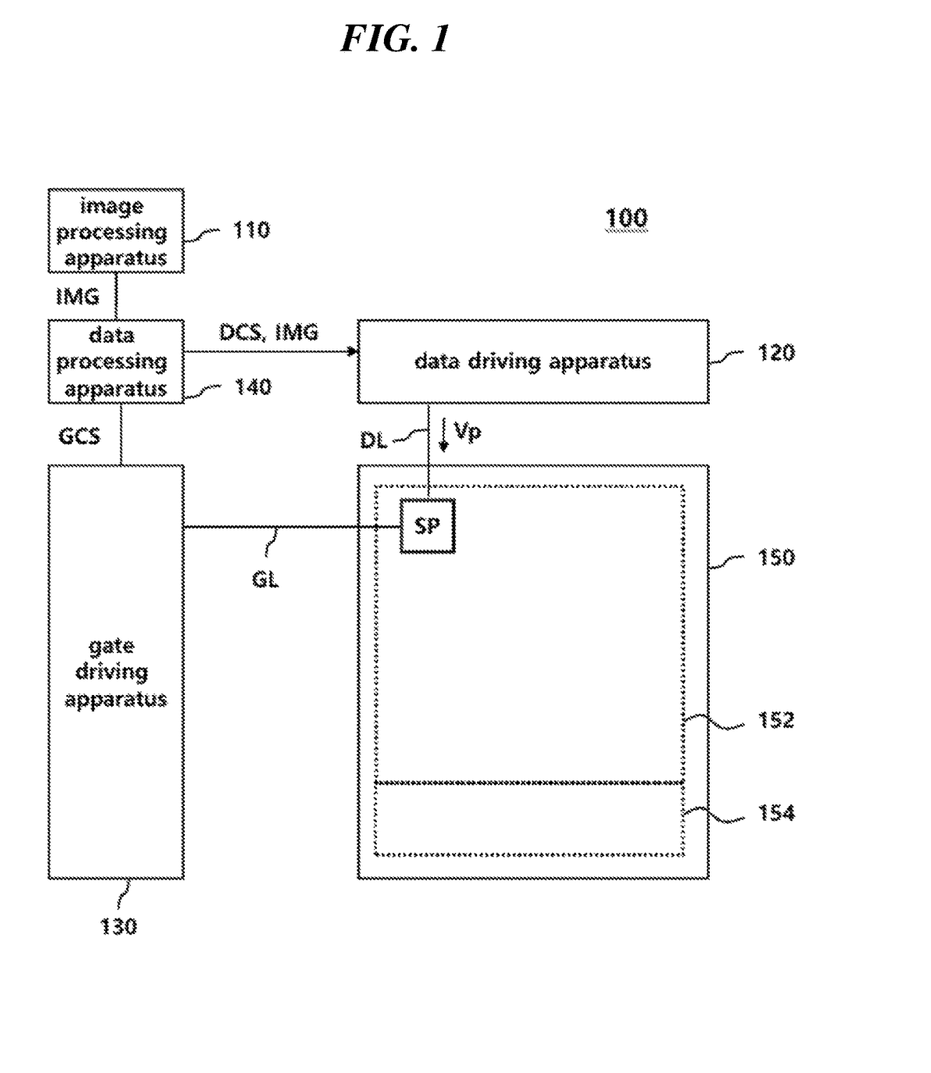
FIG. 1 is a block diagram of a display device according to an embodiment of the present disclosure.

FIG. 1 is a block diagram of a display device according to an embodiment of the present disclosure.

Referring to FIG. 1, the display device 100 may comprise a display panel 150 and multiple display panel driving apparatuses including an image processing apparatus 110, a data driving apparatus 120, a gate driving apparatus 130, and a data processing apparatus 140.

On the display panel 150, multiple data lines DL, multiple gate lines GL, and multiple pixels may be disposed. A pixel P may comprise multiple sub-pixels SP. The sub-pixels here may be R (red), G (green), B (blue), and W (white). A pixel may comprise of RGB sub-pixels SP, RGBG sub-pixels SP, or RGBW sub-pixels SP. For convenience's sake of description, the present disclosure will be described hereinafter on supposition that a pixel comprises of RGB sub-pixels SP.

A display panel driving apparatus 110, 120, 130, and 140 is an apparatus for generating signals for displaying images on a display panel 150. An image processing apparatus 110, a data driving apparatus 120, a gate driving apparatus 130, and a data processing apparatus 140 may correspond to it.

The gate driving apparatus 130 may supply gate driving signals of turn-on voltage or turn-off voltage to gate lines GL. When a gate driving signal of turn-on voltage is supplied to a sub-pixel SP, the sub-pixel SP is connected with one of the data lines DL. When a gate driving signal of turn-off voltage is supplied to the sub-pixel SP, the sub-pixel SP is disconnected from the data line DL. A gate driving apparatus 130 may be called a gate driver.

The data driving apparatus 120 may supply data voltage Vp to a sub-pixel SP through a data line DL. The data voltage Vp supplied through the data line DL may be supplied to a sub-pixel SP according to the gate driving signal. A data driving apparatus 120 may be called a source driver.

The data driving apparatus 120 may comprise at least one integrated circuit and this at least one integrated circuit may be connected to a bonding pad of the panel 150 in a tape automated bonding (TAB) type or a chip-on-glass (COG) type, directly formed on the panel 150, or integrated on the panel 150 depending on embodiments. In addition, the data driving apparatus 120 may be formed in a chip-on-film (COF) type.

In a case when the data driving apparatus 120 is formed in a chip-on-glass type, the integrated circuits forming the data driving apparatus 120 may be formed on the periphery 154 of an active area 152 where sub-pixels SP are disposed.

Meanwhile, since the area of a periphery 154 becomes narrow because an active area 152 of a panel 150 recently tends to be maximized, the chip sizes of integrated circuits forming a data driving apparatus 120 needs to be smaller and its peripheral wiring needs to be simplified as well. A conventional data driving apparatus adopts a method of connecting external signals, for example voltage, or external elements, for example resistance, to a specific terminal of integrated circuits to obtain set values. However, such a method increases the size of chips and the complexity of their peripheral wirings. To remedy such problems in an aspect, an embodiment of the present disclosure provides a method of transmitting information using link data.

The data processing apparatus 140 may supply control signals to the gate driving apparatus 130 and the data driving apparatus 120. For example, the data processing apparatus 140 may transmit gate control signals GCS which makes a scan started to the gate driving apparatus 130. In addition, the data processing apparatus 140 may output image data IMG to the data driving apparatus 120. Further, the data processing apparatus 140 may transmit data control signals DCS for controlling the data driving apparatus 120 to supply data voltage Vp to each sub-pixel. A data processing apparatus 140 may be called a timing controller.

The image processing apparatus 110 may generate image data IMG and transmit the same to the data processing apparatus 140. An image processing apparatus 110 may be called a host.

The data processing apparatus 140 may comprise at least one data processing circuit implemented in a form of an integrated circuit and the data driving apparatus 120 may comprise at least one data driving circuit implemented in a form of an integrated circuit.

Between the data processing circuit and the data driving circuit, a high-speed communication interface is formed and the data processing circuit may transmit data control signals DCS and/or image data IMG to the data driving circuit through such a high-speed communication interface.

Figure 2:
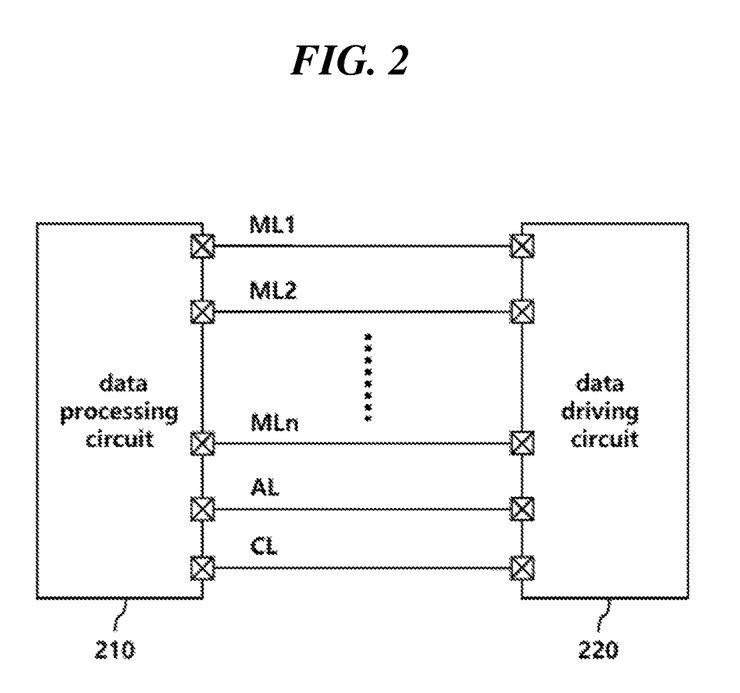
FIG. 2 is a block diagram showing the connection between a data processing circuit and a data driving circuit according to an embodiment of the present disclosure.

FIG. 2 is a block diagram showing the connection between a data processing circuit and a data driving circuit according to an embodiment of the present disclosure.

Referring to FIG. 2, a data processing circuit 210 and a data driving circuit 220 may be connected with each other through multiple main lines ML1, ML2, ..., MLn, at least one auxiliary line AL, and at least one clock line CL.

Through the auxiliary line AL, auxiliary signals may be transmitted. An auxiliary signal can be, for example, a signal indicating a state of the data driving circuit 220. When an auxiliary signal has a first level of voltage, it may indicate that the data driving circuit 220 is in a state where the data reception is possible and when an auxiliary signal has a second level of voltage, it may indicate that the data driving circuit 220 is in a state where the data reception is difficult. Here, the first level and the second level may be the different voltage levels. An auxiliary signal may be called a lock signal. In the phase locked loop (PLL) method, a data receiving side may comprise a step of adjusting a clock phase in accordance with a communication signal and when the clock phase is adjusted, a lock signal may be changed into the one at high level.

According to an embodiment, through an auxiliary line AL, lock signals may be transmitted. Here, the lock signals may indicate the state of adjustment of clock phase as well as other states of the data driving circuit 220. For example, the level change of the lock signal from high to low may indicate that the data driving circuit 220 is in a state where the data reception is difficult or that communication signals transmitted to the data driving circuit 220 are abnormal.

Through a clock line CL, clock patterns may be transmitted. A clock pattern, for example, may indicate a byte unit of data transmitted through the main lines ML1, ML2, ..., MLn. The data driving circuit 220 may recognize data by the byte unit according to clock patterns.

The data driving circuit 220 may receive clock patterns through the clock line and train a communication clock according to the clock patterns. In addition, the data driving circuit 220 may receive data transmitted through the main lines ML1, ML2, ..., MLn in accordance with the communication clock.

Depending on embodiments, there could be no clock line CL. In this case, clock patterns may be embedded in data transmitted through the main lines ML1, ML2, ..., MLn. Such a clock pattern is called an embedded clock.

Through the main lines ML1, ML2, ..., MLn, communication signals of low voltage and high frequency may be transmitted.

The main lines ML1, ML2, ..., MLn may operate in pairs. Two main lines in pair may transmit communication signals in a differential method. Here, the voltage formed in the two lines may be low. The low voltage means voltage lower than the range of data voltage supplied to each sub-pixel, for example, 3.3V. A range of data voltage may be understood, for example, as a voltage difference between data voltage when the grayscale value is the minimum or the maximum and voltage formed in a data line when no data voltage is supplied.

Through the main lines ML1, ML2, ..., MLn, data may be transmitted. Data may comprise information or patterns.

For example, configuration data or image data transmitted through the main lines ML1, ML2, ..., MLn may include information. The configuration data may include information about all set values necessary for the operation of the data driving circuit 220 and the image data may include information about a grayscale value of each pixel. The configuration data may include the data control signals described above referring to FIG. 1 (see DCS in FIG. 1) and the image data may be the image data described above referring to FIG. 1 (see IMG in FIG. 1).

Link data transmitted through the main lines ML1, ML2, ..., MLn may include patterns. Here, a pattern may indicate periodic changes of a signal. The data processing circuit 210 and the data driving circuit 220 exchange data in a non-synchronized state because of the delay or others in the main lines ML1, ML2, ..., MLn. For the transmission or the reception of data in such a non-synchronized state, the data driving circuit 220 trains data links using link data and receives configuration data or image data according to the trained data links.

Link data is transmitted and received mainly for the training of data links, however, according to an embodiment, link data may be transmitted and received for the indication of an information.

The data processing circuit 210 and the data driving circuit 220 may transmit and receive predetermined link data. The data processing circuit 210 may generate configuration data or image data according to the predetermined link data and transmit them. The data driving circuit 220 may train the data links according to the predetermined link data and receive the configuration data or image data according to the trained data links.

The data links indicate, for example, the byte unit or the pixel unit of transmitted or received data and when the data links are trained, the data driving circuit 220 may read the transmitted and received data by an appropriate unit. For example, the data driving circuit 220 may read received image data by an appropriate byte unit and an appropriate pixel unit. Data transmitted through the main lines ML1, ML2, ..., MLn may be transmitted by the bit unit in series and the data driving circuit 220 may read data by the byte unit indicated by a byte clock and by the pixel unit indicated by a pixel clock. Here, the data driving circuit 220 may train data links by adjusting the delays of byte clocks and pixel clocks or the delay of received data in the process of training data links.

The data processing circuit 210 and the data driving circuit 220 may recognize predetermined multiple link data. Further, the data driving circuit 220 may correspondingly train data links using the multiple link data. Here, correspondingly training data links may mean that, for example from the aforementioned description, it is possible to synchronize data with the same byte clock and pixel clock by adjusting the data delay or to train data links by adjusting the delay of the same byte clock and pixel clock.

Multiple link data may respectively include different information. For example, multiple link data may respectively indicate different set values. When the data driving circuit 220 operates in two or more modes, a first link data may indicate a first mode and a second link data may indicate a second mode. In this example, the data driving circuit 220 may equally train data links using the first and the second link data while receiving information different from each other from them.

The link data may include various information according to the agreement between the data processing circuit 210 and the data driving circuit 220. For example, first information that can be checked from the first link data may include information about modes used in a process of data, for example image data, conversion. Among the modes used in the process of data conversion, the first information may include information about the operation mode of an encoder/decoder, information about the limited run length code (LRLC), information about the maximum run length (MRL), or information about the operation mode of a scrambler/descrambler.

The data processing circuit 210 may perform a conversion, for example scrambling, encoding, etc., of data, for example image data and then transmit the converted data and the data driving circuit 220 may perform an inverse conversion, for example descrambling, decoding, etc., of the received data. Here, in order to generate data suitable for the data driving circuit 220, the mode used in the conversion process of data in the data processing circuit 210 has to correspond to the mode used in the inverse conversion process of data in the data driving circuit 220. In order to transfer the mode used in the data conversion process to the data driving circuit 220, the data processing circuit 210 may transmit information indicating the corresponding mode through the link data.

Figure 3:
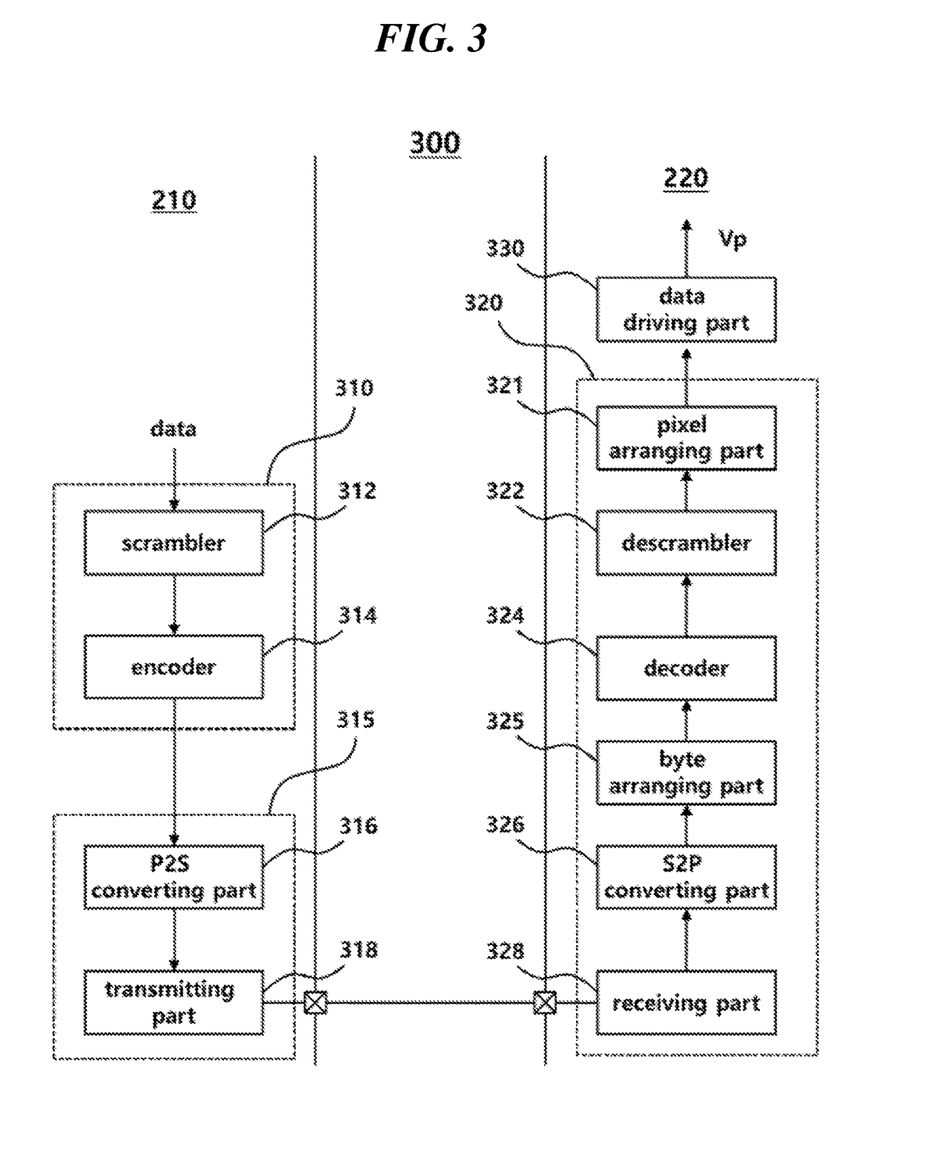
FIG. 3 is a block diagram of a driving system comprising a data processing circuit and a data driving circuit according to an embodiment of the present disclosure.

FIG. 3 is a block diagram of a driving system comprising a data processing circuit and a data driving circuit according to an embodiment of the present disclosure.

Referring to FIG. 3, the driving system 300 for a display device may comprise a data processing circuit 210 and a data driving circuit 220.

The data processing circuit 210 may comprise a scrambler 312, an encoder 314, a P2S converting part 316, and a transmitting part 318 and the data driving circuit 220 may comprise a receiving part 328, a S2P converting part 326, a byte arranging part 325, a decoder 324, a descrambler 322, a pixel arranging part 321, and a data driving part 330. In the data processing circuit 210, the scrambler 312 and the encoder 314 may be grouped in a data processing part 310 and the P2S converting part 316 and the transmitting part 318 may be grouped in a data transmitting part 315. In the data driving circuit 220, the receiving part 328, the S2P converting part 326, the byte arranging part 325, the decoder 324, the descrambler 322, and the pixel arranging part 321 may be grouped in the data receiving part 320.

In the data processing circuit 210, data is scrambled by the scrambler 312. Scrambling is a process of mixing all bits of transmitted data and it may prevent the same bits such as 1 or 0 from being consecutively arranged more than K (K is a natural number which is 2 or higher) times in a data stream to be transmitted. The scrambling proceeds according to a predetermined protocol and the descrambler 322 of the data driving circuit 220 may restore streams where all bits are mixed to original data.

The data processing circuit 210 may operate the scrambler 312 in multiple modes and transmit the operation modes of the scrambler 312 to the data driving circuit 220 using link data. The data driving circuit 220 may operate the descrambler 322 in the modes indicated by information checked from the link data.

The data processing circuit 210 may not use the scrambler 312. In this case, the data processing circuit 210 may indicate the use of scrambling in the process of data, for example image data, conversion using the link data. The data driving circuit 220 may check the use of scrambling from the link data and then perform a descrambling or not.

The encoder 314 may encode P bits in a data stream to be transmitted into Q bits. For example, P may be 8 and Q may be 10. Encoding data of 8 bits into data of 10 bits may be called 8B10B encoding. The 8B10B encoding is one of methods of encoding data into DC balance codes.

The encoder 314 may encode data such that the number of bits of stream to be transmitted increases. The encoded data may be decoded into DC balance codes, for example 8B10B, by the decoder in the data driving circuit 220. In another aspect, the encoded data may be restored into data of the original number of bits by the decoder 324 in the data driving circuit 220.

The encoder 314 may use the LRLC when encoding data. "Run Length" means consecutive arrangement of the same bits and the LRLC is to control specific bits respectively between data in order that the Run Lengths remain less than a certain size.

When the encoder 314 encodes data using the LRLC, the decoder 314 may decode data according to the LRLC method used by the encoder 314.

The data processing circuit 210 may operate the encoder 314 in multiple modes and transmit the operation modes of the encoder 314 to the data driving circuit using the link data. The data driving circuit 220 may operate the decoder 324 in the modes indicated by information checked from the link data.

The encoder 314 may use a first mode but not a second mode. For example, the encoder 314 may use the 8B10B encoding as a first mode but not use the LRLC as a second mode. Here, the data processing circuit 210 may indicate the use of each mode using the link data. For example, the information checked from the link data may indicate the use of LRLC. In addition, the decoder 324 may decode data depending on the information about the LRLC.

The information checked from the link data may indicate the MRL (maximum run length: the allowable maximum size of "Run Length"). The decoder 324 may decode data according to the MRL.

Data transmitted in parallel inside the data processing circuit 210 may be converted into data transmitted in series for the transmission between the data processing circuit 210 and the data driving circuit 220. The conversion of data in parallel into that in series may be performed by the P2S converting part 316 in the data processing circuit 210. The S2P converting part 326 in the data driving circuit 220 may convert data received in series into data in parallel.

The converted data in series may be transmitted to the data driving circuit 220 through the transmitting part 318 in the data processing circuit 210.

The data received by the data driving circuit 220 may be transmitted to the byte arranging part 325, the decoder 324, the descrambler 322, and the pixel arranging part 321 via the receiving part 328 and the S2P converting part 326.

The transmitting part 318 may transmit data through one or more communication channels. Each communication channel may comprise of two communication lines to transmit signals in a differential method. When multiple communication channels are used, the transmitting part 318 may disperse data to transmit them through the multiple communication channels. The receiving part 328 may collate signals dispersedly received through the multiple communication channels and form data.

The data processing circuit 210 may transmit the number of pairs of the communication lines or the number of the communication lines, through which data, for example image data is transmitted, to the data driving circuit 220 using the link data. The data driving circuit 220 may convert data according to the number of pair of the communication lines or the number of the communication lines checked from the link data.

The data driving circuit 220 may train the data links according to the link data. The byte arranging part 325 and the pixel arranging part 321 may arrange data by the byte unit and by the pixel unit according to the trained data links.

The byte arranging part 325 may arrange data by the byte unit. The byte unit is a basic unit configuring information included in data and may be, for example, 8 bits or 10 bits. The byte arranging part 325 may arrange data in order that data may be read by the byte unit.

The pixel arranging part 321 may arrange data by the pixel unit. Data may include information corresponding to sub-pixels such as RGB in sequence. The pixel arranging part 321 may arrange data in order that data may be read by the pixel unit.

When image data is arranged by the pixel unit by the pixel arranging part 321, grayscale data of each sub-pixel may be generated.

The data driving part 330 may generate data voltage Vp according to the grayscale data indicating a grayscale value of each sub-pixel and drive each sub-pixel with the data voltage Vp.

Figure 4:
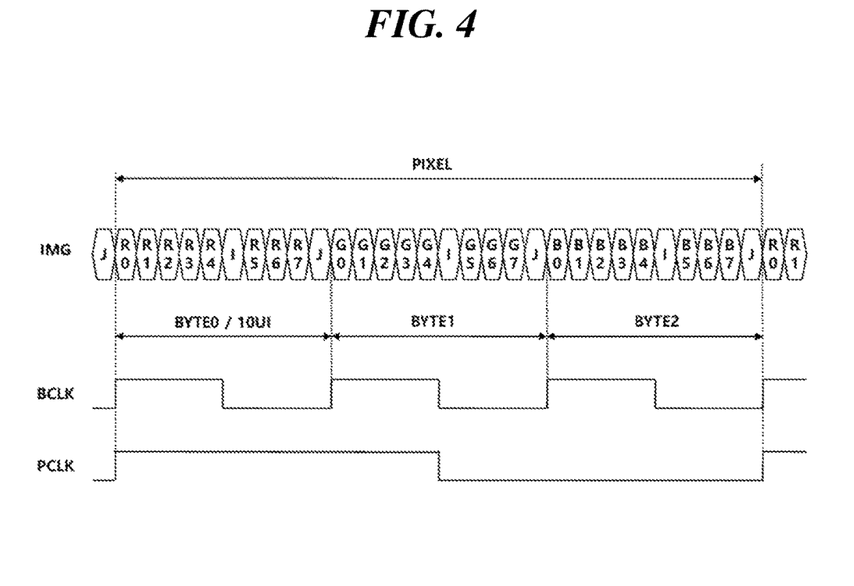
FIG. 4 shows an example of an image data and a data link according to an embodiment of the present disclosure.

FIG. 4 shows an example of image data and a data link according to an embodiment of the present disclosure.

The data driving circuit 220 may train the data links by performing the arrangements of the link data by the byte unit and by the pixel unit. Further, the data driving circuit 220 may arrange the image data IMG according to the trained data links.

The data driving circuit 220 may arrange the image data IMG in accordance with a byte clock BCLK. Here, the byte clock BCLK may be considered as an element of a data link. The data driving circuit 220 may arrange the image data IMG such that the beginning parts of the bytes BYTE0, BYTE1, and BYTE2 of the image data may be adjusted to be placed respectively at the points corresponding to the rising edges of the byte clock.

The image data IMG may be transmitted in a predetermined order of the sub-pixels. In the example shown in FIG. 4, the image data IMG is transmitted in R, G, and B order.

The data driving circuit 220 may arrange the image data IMG in accordance with a pixel clock PCLK. Here, the pixel clock PCLK may be considered as another element of a data link. The data driving circuit 220 may arrange the image data IMG such that the beginning parts of the pixels PIXEL of the image data, for example, data corresponding to R may be adjusted to be placed respectively at the points corresponding to the rising edges of the pixel clock PCLK.

Figure 5:
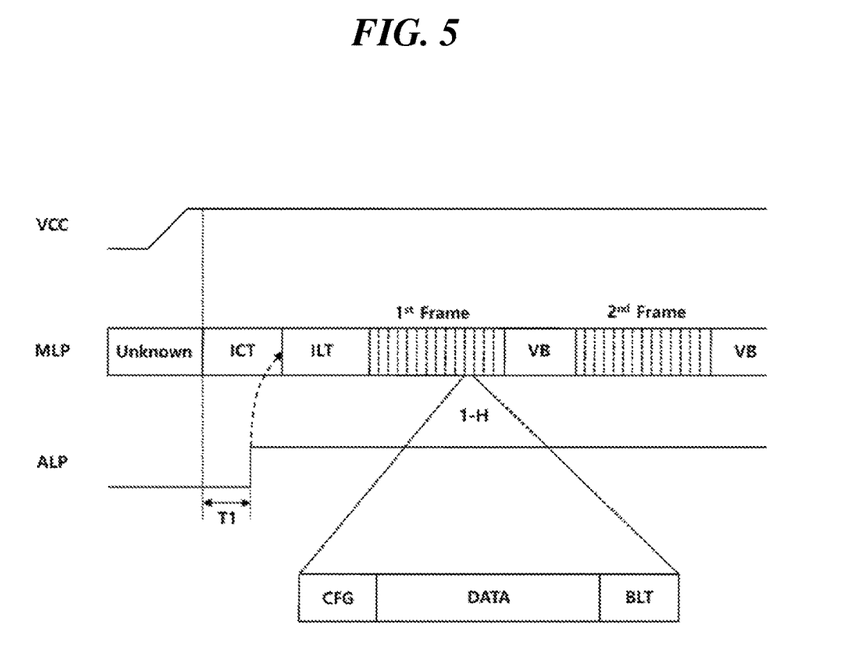
FIG. 5 shows a sequence of a communication signal and an auxiliary signal according to an embodiment of the present disclosure.

FIG. 5 shows a sequence of a communication signal and an auxiliary signal according to an embodiment of the present disclosure. In FIG. 5, a waveform of driving voltage VCC supplied to the data processing circuit is subsidiarily shown.

In FIG. 5, a communication signal MLP is a signal transmitted through the main lines described above referring to FIG. 2 and an auxiliary signal ALP is a signal transmitted through the auxiliary line described above referring to FIG. 2.

When driving voltage VCC is supplied to the data processing circuit 210, the data processing circuit 210 may transmit clock patterns within a certain period of time. FIG. 5 shows that the clock patterns in a form of a communication signal MLP are transmitted through the main lines. However, the clock patterns may be transmitted through the clock line described above referring to FIG. 2.

The data driving circuit 220 may receive clock patterns and train a communication clock according to the clock patterns. After the training of the communication clock is completed, the data driving circuit 220 may change the auxiliary signal formed in the auxiliary line from low level into high level.

The data processing circuit 210 and the data driving circuit 220 may perform a communication in the PLL method. Here, the data driving circuit 220 may train a communication clock in the PLL method generating inside communication clocks in accordance with the frequency and the phase of clock patterns.

The data driving circuit 220 may complete the clock training within a first unit time T1. The data processing circuit 210 may transmit clock patterns during an initial clock training interval ICT, which is longer than the first unit time T1, including a certain margin time.

The clock training may be performed only once at an early stage of transmitting data. When the link between the data processing circuit and the data driving circuit is broken, the stage of transmitting data returns to the early stage and the clock training may be performed.

After the clock training is completed, the data processing circuit 210 may transmit the link data through the main lines.

The data driving circuit 220 may receive the link data in accordance with the communication clock and train the data link according to the link data. The link training may be performed during the initial link training interval ILT when the data processing circuit transmits the link data.

The link training may be performed only once at the early stage of transmitting data. When the link between the data processing circuit and the data driving circuit is broken, the stage of transmitting data returns to the early stage and the link training may be performed.

After the link training is completed, the data processing circuit 210 may transmit the image data through the main lines.

The image data may be transmitted by frame and there exist vertical blanking intervals VB between the frames of the image data transmission.

One frame may include multiple sub-time-intervals and image data may be transmitted during one interval of each sub-time-interval.

For example, one frame may include multiple H time intervals (1-H, horizontal period) respectively corresponding to multiple lines in a display panel and the data processing circuit may transmit image data corresponding to each line every H time interval 1-H.

A H time interval in the data processing circuit 210 may comprise of, for example, a configuration transmitting interval (an interval for transmitting configuration data), an image transmitting interval and a horizontal blanking interval (or a link transmitting interval). The data processing circuit 210 may transmit image data during the image transmitting interval of each H time interval 1-H. A H time interval in the data driving circuit 220 may comprise of a configuration receiving interval CFG, an image receiving interval DATA and a horizontal blanking interval (or a link receiving interval BLT). The data driving circuit 220 may receive image data during the image data receiving interval DATA.

The data driving circuit 220 may receive image data during the image receiving interval DATA and arrange the image data in accordance with a data link. Since image data is transmitted without any clock or link signal, the data driving circuit should read it by an appropriate segment. The data driving circuit 220 may arrange image data in accordance with the aforementioned data link and read it by an appropriate segment.

The data driving circuit 220 may check configuration data, image data or link data and generate a fail signal when the configuration data, image data or link data is out of a predetermined protocol. A fail signal means that a link between the data processing circuit and the data driving circuit is broken. The data driving circuit 220 may count fail signals and change the state of an auxiliary signal connected with the data processing circuit when more than N (N is a natural number) fail signals are generated.

When the state of the auxiliary signal is changed, the data processing circuit 210 returns to the early stage and it may re-transmit clock patterns during the initial clock training interval ICT and re-transmit link data during the initial link training interval ILT. The data driving circuit may train communication clocks in accordance with clock patterns and re-train the data links in accordance with the link data.

Meanwhile, the data driving circuit 220 may check set values and perform the decoding or descrambling according to the set values in a process of converting data such as decoding or descrambling configuration data or image data. However, to normally perform these conversions, the set values should be checked prior to the data conversion. According to an embodiment, the data driving circuit 220 may check set values through the link training performed prior to the reception of configuration data or image data. According to an embodiment, link data transmitted for the link training may perform the indication of set values besides the training of data links and the data driving circuit may check set values according to information that the link data indicates.

A link data may include a specific pattern and the data driving circuit may distinguish link data by recognizing the pattern of link data and check the information that the link data indicates.

Figure 6A:
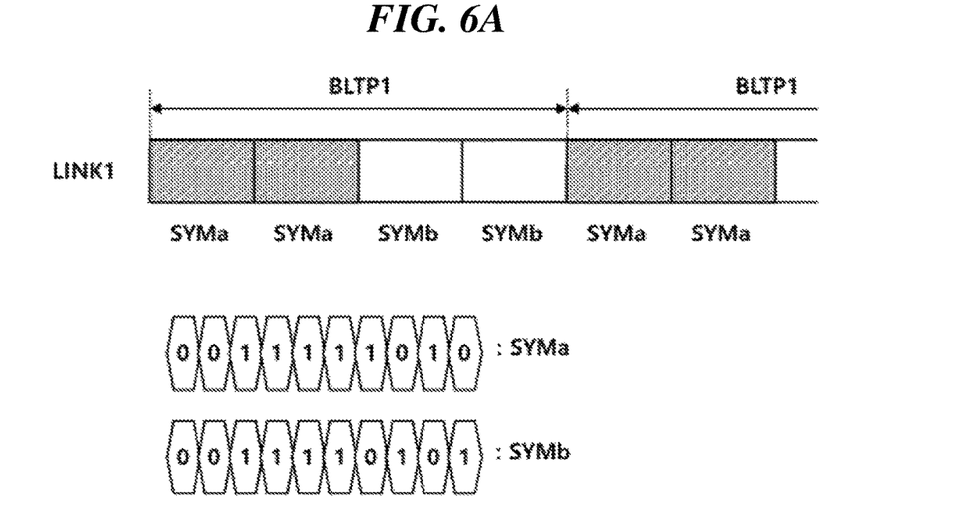
FIGS. 6A, 6B, and 6C show examples of link data according to an embodiment of the present disclosure.
Figure 6B:
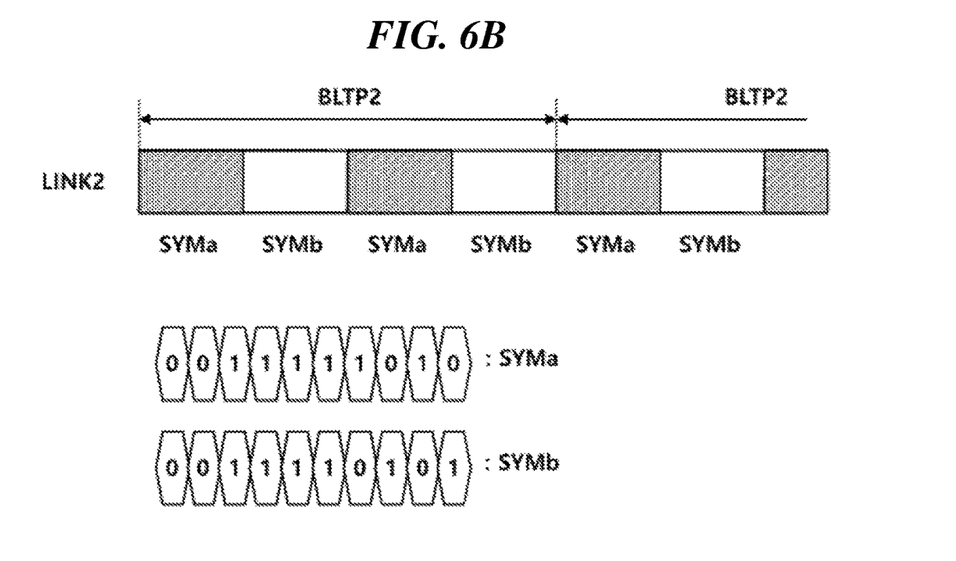
Figure 6C:
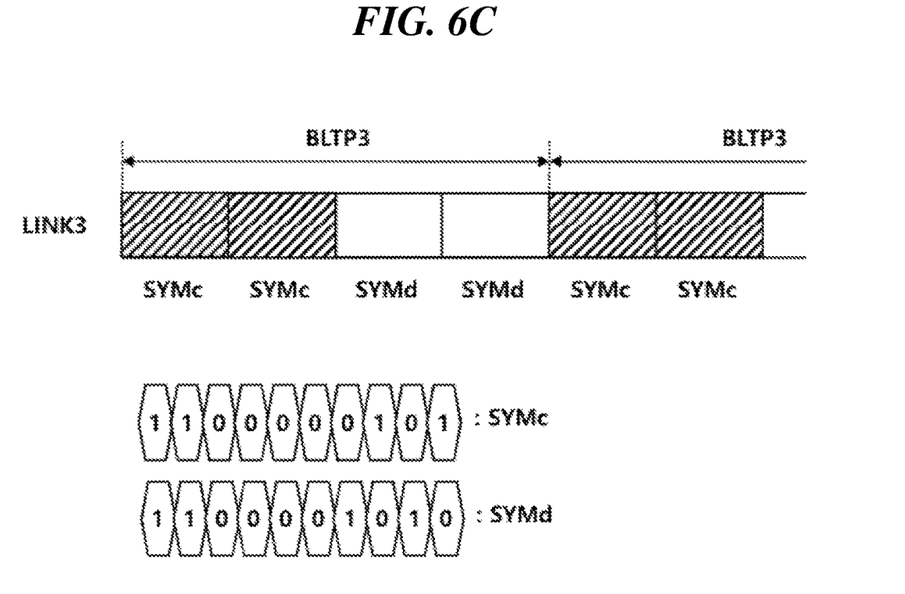

FIGS. 6A, 6B, and 6C show examples of link data according to an embodiment of the present disclosure.

A link data may comprise of multiple symbols and the data driving circuit 220 may arrange image data by the byte unit using one of the multiple symbols included in a link data and by the pixel unit using two or more thereof.

Multiple link data used in the data processing circuit 210 may differ from those used in the data driving circuit in the kinds of symbols or the dispositions thereof.

Referring to FIG. 6A, a first link data LINK1 may comprise of two or more consecutively disposed link patterns BLTP1 comprising two consecutive first symbols SYMa and two consecutive second symbols SYMb.

The first symbol SYMa may mean 0011111010 and the second symbol SYMb may mean 0011110101.

Referring to FIG. 6B, a second link data LINK2 may comprise of two or more consecutively disposed link patterns BLTP2 comprising twe sets of alternate first and second symbols SYMa and SYMb.

The first link data LINK1 and the second link data LINK2 have different patterns respectively having the different cycles of symbols SYMa and SYMb, i.e., the different forms of symbol repetition. The first link data LINK1 has a twice longer cycle than that of the second link data LINK2. In other aspect, the frequency of the second link data LINK2 is twice of the frequency of the first link data LINK1. The data driving circuit may check information indicated by the link data by recognizing the cycle of the repetitive patterns or the frequency thereof.

Referring to FIG. 6C, a third link data LINKS may comprise of two or more consecutively disposed link patterns BLTP3 comprising two consecutive third symbols SYMc and two consecutive fourth symbols SYMd.

The third symbol SYMc may mean 1100000101 and the fourth symbol SYMd may mean 1100001010.

The first link data LINK1 and the third link data LINKS are same in their cycles of the repetitive patterns but different in their symbols, i.e., the kinds of symbols. The data driving circuit may check information indicated by the link data by recognizing the symbols of the link data.

Figure 7:
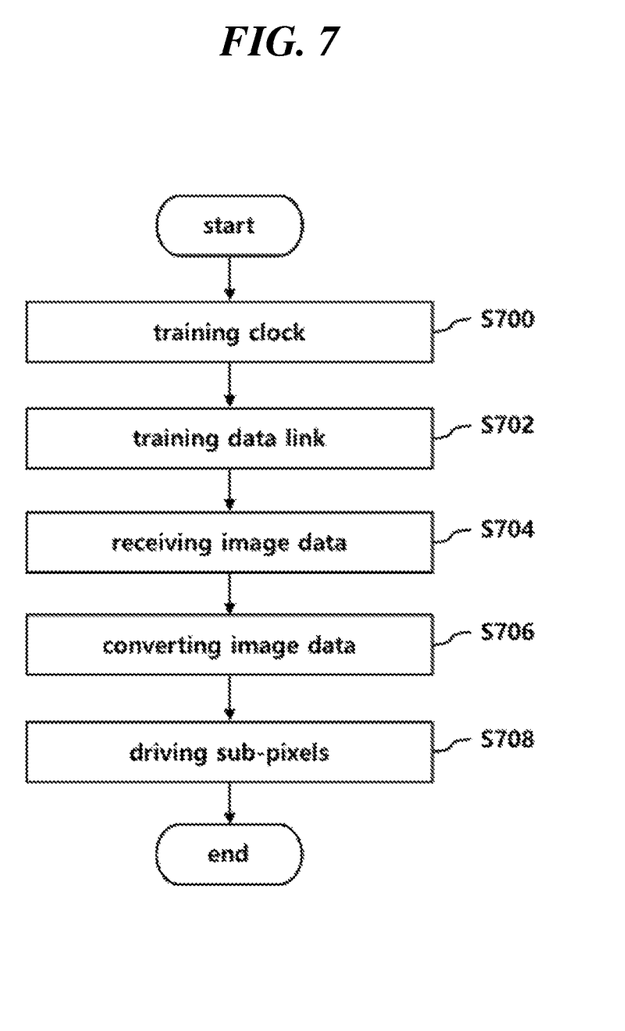
FIG. 7 is a flow chart of a method for driving a panel according to an embodiment of the present disclosure.

FIG. 7 is a flow chart of a method for driving a panel according to an embodiment of the present disclosure.

The method for driving a panel to be described with reference to FIG. 7 may be performed by the data driving circuit described above.

Referring to FIG. 7, the data driving circuit 220 may receive clock patterns and train communication clocks according to the clock patterns S700.

After training the communication clocks, the data driving circuit 220 may receive link data in accordance with the communication clocks and train data links according to the link data S702. In the step S702 of training data links, the data driving circuit 220 may train the data links by performing an arrangement by the byte unit and an arrangement by the pixel unit.

The data driving circuit 220 may receive one of multiple link data. Multiple link data may respectively have different link patterns and each of them may indicate different information. The data driving circuit 220 may check the link pattern of each link data to check the information that each link data indicates. For example, at least two of multiple link data may respectively have different repetitive patterns and the data driving circuit 220 may check the cycle of repetitive patterns of the link data to check the information that each link data indicates.

After training the data links, the data driving circuit 220 may receive image data in accordance with the data links S704.

After that, the data driving circuit 220 may convert, for example decode or descramble the image data according to the information that the link data indicates S706.

Next, the data driving circuit 220 may drive sub-pixels using data voltage generated by the conversion of image data S708.

The information of the link data may indicate the operation mode of a decoder used in the step of converting image S705, the use of the LRLC or MRL, or the operation mode of a descrambler. Otherwise, the information of the link data may indicate the number of pairs of communication lines or the number of communication lines through which image data is transmitted.

Figure 8:
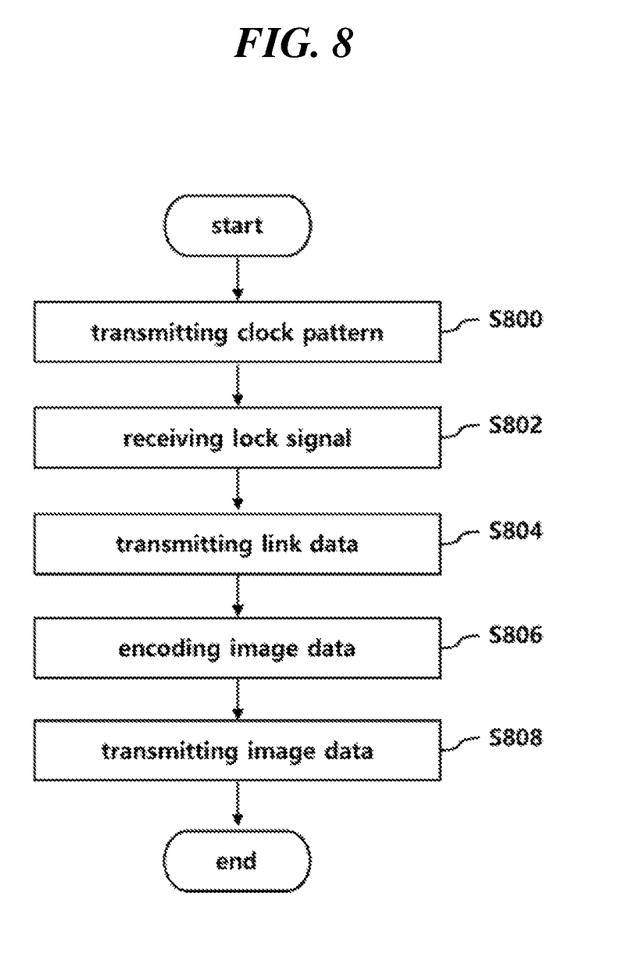
FIG. 8 is a flow chart of a method for transmitting image data according to an embodiment of the present disclosure.

FIG. 8 is a flow chart of a method for transmitting image data according to an embodiment of the present disclosure.

The method for transmitting image data to be described with reference to FIG. 8 may be performed by the aforementioned data processing circuit 210.

Referring to FIG. 8, the data processing circuit 210 may transmit clock patterns indicating communication clocks to the data driving circuit S800. The data driving circuit 220 may train the communication clocks according to the clock patterns. When the training of the communication clocks is completed, the data driving circuit 220 may transmit lock signals to the data processing circuit.

After receiving the lock signals S802, the data processing circuit 210 may transmit link data to the data driving circuit S804. The data processing circuit 210 may synchronize one of multiple link data indicating first information with a communication clock and transmit the same.

After that, the data processing circuit 210 may encode the image data according to the first information S806 and transmit the encoded image data to the data driving circuit S808.

The step of encoding image data S806 may comprise a step of scrambling image data or a step of encoding image data with the LRLC. In addition, the data processing circuit 210 may transmit the operation mode applied to the step of scrambling the image data or encoding the image data with the LRLC to the data driving circuit using the first information.

The first information may indicate a bit rate of image data. The data driving circuit 220 may receive image data in accordance with the bit rate of image data checked from the first information.

As described above, the present disclosure allows stably and efficiently transferring set values to an image data receiving apparatus Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although an embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A data driving apparatus comprising:
a data receiving part for training a communication clock according to received clock patterns, receiving, in accordance with said communication clock, at least one link data selected from multiple link data respectively including same or different information, training a data link in accordance with said at least one link data, receiving image data in accordance with the data link, and converting said image data to generate grayscale data for each sub-pixel; and
a data driving part for generating data voltage according to said grayscale data and driving each sub-pixel with said data voltage,
wherein said data receiving part converts the image data according to at least one information included in said at least one link data.

2. The data driving apparatus of claim 1, wherein said at least one information includes information about an operation mode of a decoder used for a conversion of said image data.

3. The data driving apparatus of claim 1, wherein said at least one information includes information about a limited run length code (LRLC) and said data receiving part decodes said image data according to said information about the LRLC.

4. The data driving apparatus of claim 1, wherein said at least one information includes information about a maximum run length (MRL) and said data receiving part decodes said image data according to said information about the MRL.

5. The data driving apparatus of claim 1, wherein at least two link data among said multiple link data respectively have different cycles of repeated patterns.

6. The data driving apparatus of claim 1, wherein said at least one information includes information about a number of pairs of communication lines or a number of communication lines through which said image data is transmitted and said data receiving part converts said image data according to said number of pairs of communication lines or said number of communication lines.

7. The data driving apparatus of claim 1, wherein said data receiving part trains said data links by performing an arrangement of said link data by a byte unit and by a pixel unit.

8. The data driving apparatus of claim 1, wherein said at least one information includes information about a operation mode of a descrambler used for the conversion of said image data.

9. The data driving apparatus of claim 1, being disposed in a chip-on-glass (COG) manner on a periphery of an active area of a panel where said sub-pixels are disposed.

10. The data driving apparatus of claim 1, wherein said data receiving part receives configuration data in accordance with said data link and a range of said data voltage is larger than that of said configuration data voltage.

11. A data processing apparatus comprising:
a data transmitting part for transmitting clock patterns indicating a communication clock to a data driving apparatus driving sub-pixels, and synchronizing at least one link data selected from multiple link data respectively including same or different information with said communication clock to transmit the same to said data driving apparatus; and
a data processing part for encoding image data according to at least one information included in said at least one link data,
wherein said data transmitting part transmits said image data to said data driving apparatus where a data link is formed according to said at least one link data.

12. The data processing apparatus of claim 11, wherein said data transmitting part transmits again said at least one link data after receiving a lock signal.

13. The data processing apparatus of claim 11, wherein said data transmitting part scrambles said image data or encodes said image data with a limited run length code (LRLC).

14. The data processing apparatus of claim 11, wherein said multiple link data differs from each other in a kind of symbol or a disposition of symbol.

15. A display driving system comprising:
- a data processing apparatus for transmitting clock patterns indicating a communication clock, synchronizing at least one link data selected from multiple link data respectively including same or different information with said communication clock to transmit the same, and encoding image data according to at least one information included in said at least one link data; and
- a data driving apparatus for training said communication clock according to said received clock patterns, receiving said at least one link data in accordance with said communication clock, training data link according to said at least one link data, receiving said image data in accordance with said data link, and converting said image data according to said at least one information included in said at least one link data to generate grayscale data for each sub-pixel.

* * * * *